United States Patent [19]

Akino et al.

[11] 4,408,171
[45] Oct. 4, 1983

[54] NOISE FILTER WITH SOCKET ATTACHED THERETO

[75] Inventors: Tadaharu Akino, Kashiwa; Akira Nakamura, Funabashi; Hiroyuki Uemura, Narashino, all of Japan

[73] Assignee: TDK Electronics Co., Ltd., Tokyo, Japan

[21] Appl. No.: 243,607

[22] Filed: Mar. 13, 1981

[30] Foreign Application Priority Data

Mar. 13, 1980 [JP] Japan .............................. 55-31879[U]

[51] Int. Cl.³ ........................ H03H 7/01; H03H 7/09
[52] U.S. Cl. .................................... 333/177; 333/181; 333/185; 333/17 L
[58] Field of Search ................ 333/167, 177, 181–185, 333/17 L

[56] References Cited

U.S. PATENT DOCUMENTS 2,939,095  5/1960  Chertok ............................. 333/167
3,909,623  9/1975  Wagner ........................... 333/182 X
4,021,759  5/1977  Campi ............................. 333/17 L Primary Examiner—Marvin L. Nussbaum
Attorney, Agent, or Firm—Robert Scobey

[57] ABSTRACT

A noise filter with a socket attached thereto including a case made of metallic material mounting a pair of pierce type (feed through) capacitors and a power input socket having a pair of power input contacts and a grounding contact, a choke coil having a pair of coil windings wound thereabout and a capacitor interposed between said pair of coil windings mounted inside said case, said pierce type capacitors including inner piercing (feed through) terminals and outer terminals, said power input contacts and the piercing terminals of said pierce type capacitors being connected to one another via said coil windings, and said grounding contact and the outer terminals of said pierce type capacitors being electrically connected to the case.

5 Claims, 12 Drawing Figures

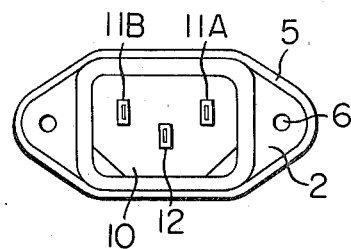
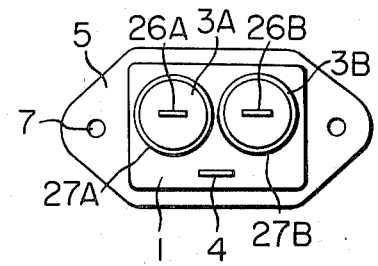
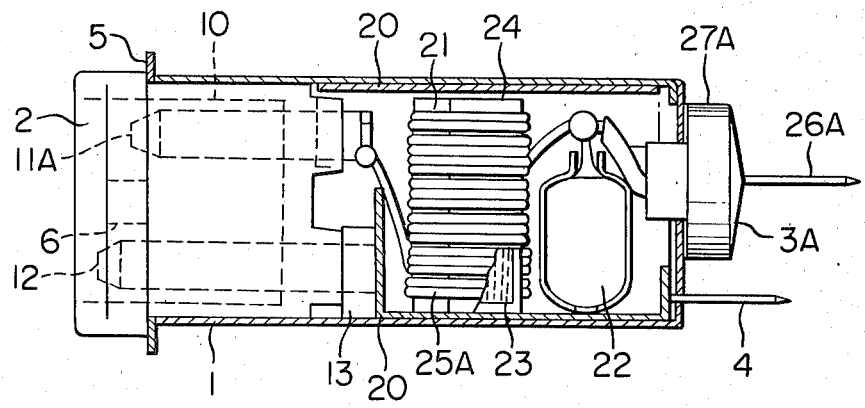
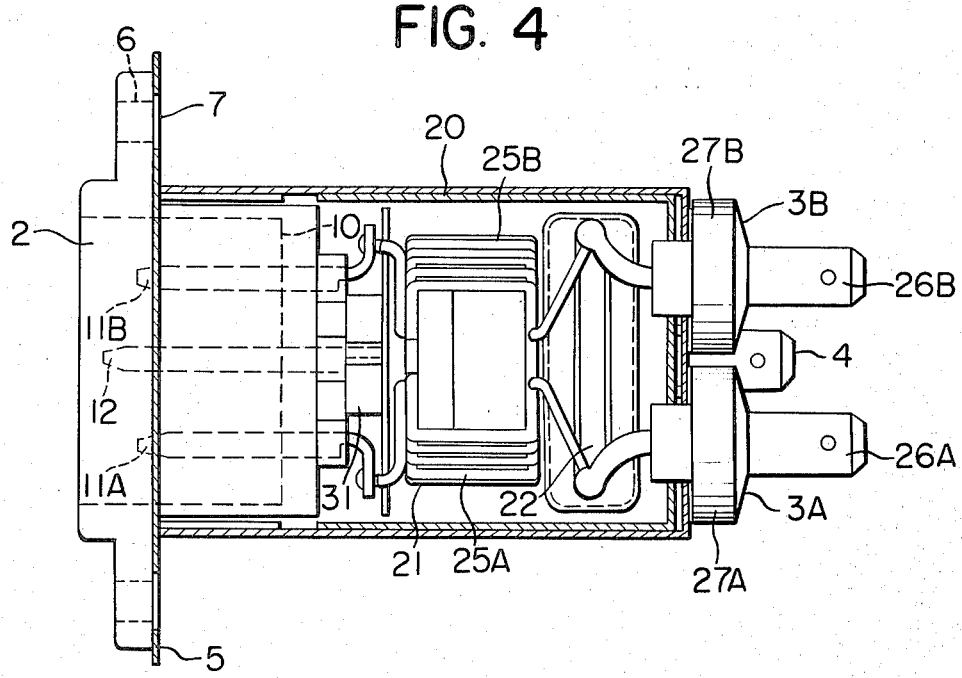

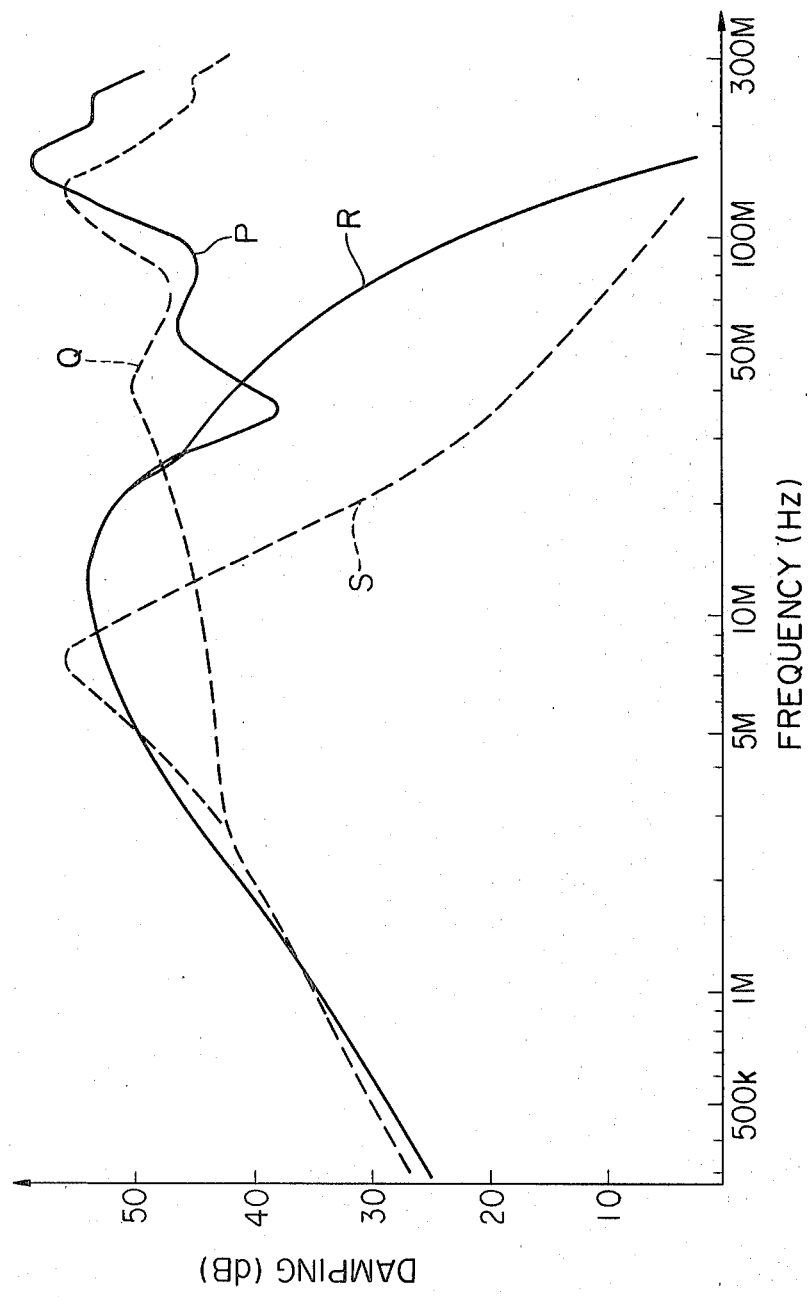

NOISE FILTER WITH SOCKET ATTACHED THERETO

BACKGROUND AND BRIEF DESCRIPTION OF THE INVENTION

The present invention relates to a noise filter, and more particularly to a noise filter and power input socket combination so as to make it possible to put the filter in use in the same manner as a conventional power input socket.

As is well known, power input sockets of the three pole type having a pair of power contacts and another grounding contact have been widely used for commercial power supply for electronic appliances, electrical apparatus and the like.

In order to resolve a noise problem with a conventional power input socket, a noise filter is usually incorporated in the electronic appliance or apparatus, away from the socket. However this causes additional noise to be radiated toward the interior of the appliance or apparatus from the wiring located between the socket and filter. As a result, insufficient noise reduction may be achieved. As another drawback, a large amount of manpower is required for mounting the noise filter and completing the necessary electrical wiring. Further, the combination of a separate socket and noise filter is undesirable in view of space requirements.

Thus the present invention is intended to obviate the drawbacks of a conventional socket accompanied by a separate noise filter as described above. It is an object of the present invention to provide an improved noise filter with a socket attached thereto which will substantially reduce manpower required for mounting and wiring by way of integrally assembling a power input socket and a noise filter, and which furthermore ensures increased noise reduction by way of transferring power via pierce type capacitors.

The invention will be more fully understood by reference to the following detailed description.

BRIEF DESCRIPTION OF THE DRAWING

FIGS. 1 and 2 are respectively front and rear views of a noise filter with a socket attached thereto embodying the present invention.

FIGS. 3 and 4 are respectively vertical and horizontal sectional views of the noise filter and socket of FIGS. 1 and 2.

FIG. 6 is a series of curves illustrating noise filter characteristics in terms of the relation between decibels of damping and frequency.

DETAILED DESCRIPTION

Figure 5:
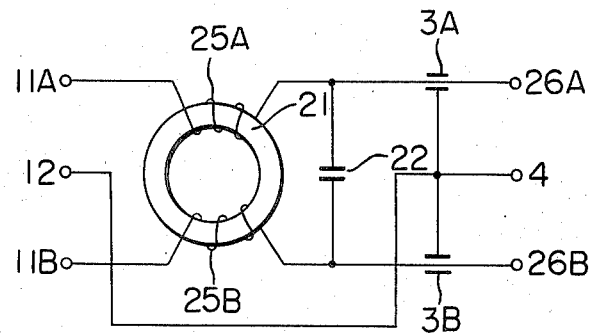
FIG. 5 is a schematic wiring diagram of the noise filter of FIGS. 1–4.
Figure 7:
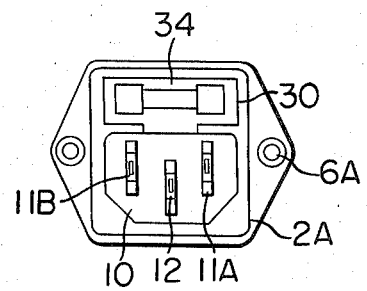
FIGS. 7 and 8 are respectively front and rear views of another noise filter and socket embodying the present invention.
Figure 8:
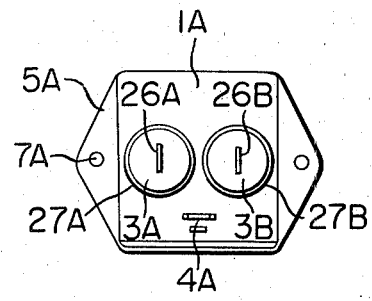
Figure 9:
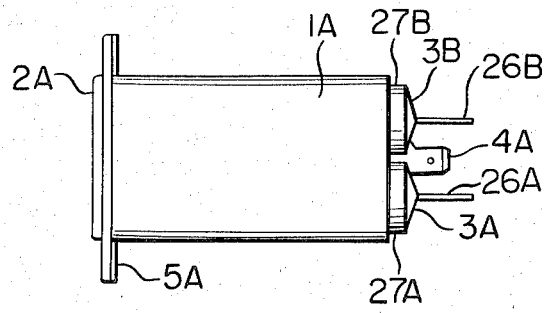
FIG. 9 is a plan view of the noise filter and socket of FIGS. 7 and 8.
Figure 10:
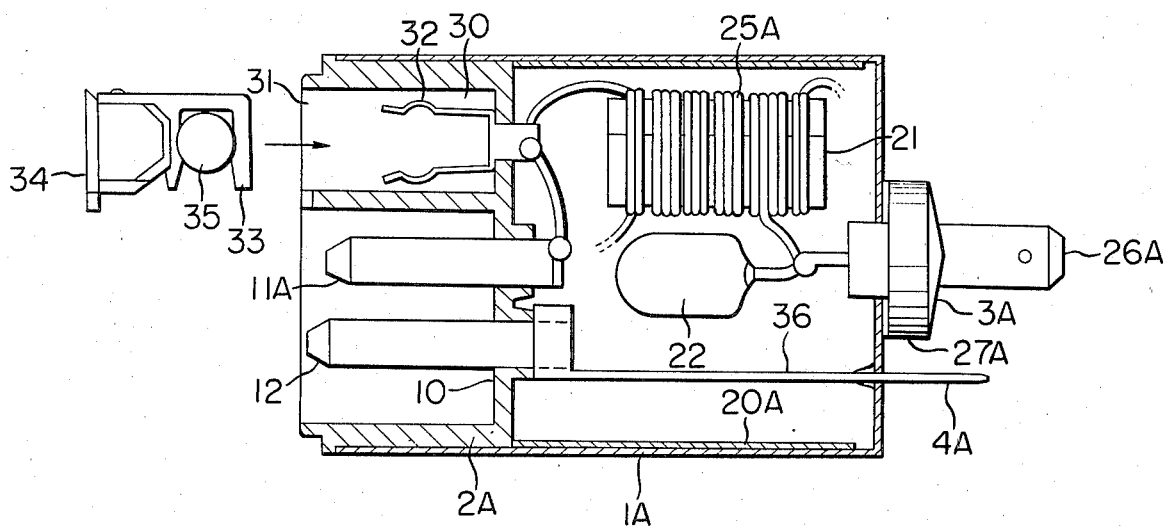
FIG. 10 is a vertical sectional view of the noise filter and socket of FIGS. 7–9, shown to an enlarged scale.

Referring to FIGS. 1 to 5, a box-shaped case 1 preferably made of current-carrying magnetic metallic material is provided with a power input socket 2 fitted into a front opening thereof, and is further provided with a pair of pierce type (feed through) capacitors 3A and 3B and a grounding terminal 4 at its rear face. Further, the box-shaped case 1 is formed with a flange portion 5 which extends outwardly from the front opening, the flange portion 5 serving to shield the rear face of the socket 2 and having drilled holes 7 which are located in alignment with corresponding holes 6 of the socket 2.

The socket 2 is formed with a deep cavity 10 which is adapted to receive a plug fitted therein, wherein a pair of power input contacts 11A and 11B and a grounding contact 12 protrude into the cavity 10 to be fixed therein. It is to be noted that the grounding contact 12 is dimensioned such that its rear end is engaged in a grounding member 13 fixed to the bottom of the case 1 by way of soldering or the like (when fitting the socket 2 into the case 1 and after contact 12 engages the grounding member 13, it is subjected to a soldering operation). As a result, the socket 2 is fixedly secured to the case 1 and may not be disconnected therefrom.

The case 1 is lined with an insulating film 20 over its inner wall so that a common mode choke coil 21 and a capacitor 22 may be contained in the hollow space defined by the insulating film. The common mode choke coil 21 is constructed in such a manner that a toroidal core 23 made of ferrite is covered with a core cover 24 on which a pair of coils 25A and 25B are arranged. The coils 25A and 25B serve to connect the rear ends of the contacts 11A and 11B to the terminals 26A and 26B of the pierce type capacitors 3A and 3B. Further, the capacitor 22 is connected between the terminals 26A and 26B. It is to be noted that the outer ends of the terminals 26A and 26B of the insert type capacitors 3A and 3B as well as the end part of the grounding terminal 4 are designed in the form of a faston tab. The terminals 27A and 27B of the pierce type capacitors 3A and 3B as well as the grounding terminal 4 are fixedly secured to the case 1 by way of soldering or the like. It is to be noted that the insulating film 20 extends between the common choke coil 21 and the grounding member 13.

A noise filter with socket attached thereto as just described may be fitted or inserted into an opening formed in a panel, chassis or the like means of an electronic appliance or apparatus in the same manner as a conventional power input socket, such an opening having the same dimensions as those of the conventional power input socket. This means that a noise filter in accordance with the present invention may be employed in place of the power input socket without any restriction. Specifically, such a noise filter is used by inserting a power plug into the socket 2, and conducting the received power into the interior of the electronic appliance or apparatus via the tab receptacles of the pierce type capacitors 3A and 3B.

Once the noise filter has been fitted or inserted, common mode noise from the power line is removed mainly by means of the common mode choke 21 as well as the pierce type capacitors 3A and 3B, whereas normal mode noise is removed mainly by means of the condensor 22.

FIG. 6 illustrates the relationship between damping and frequency. Solid line P and dashed line Q respectively represent damping of normal mode and common mode noise with a noise filter as in FIGS. 1–5. Solid line R and dashed line S respectively represent damping of normal mode and common mode noise in the case of a conventional individual socket and individual noise filter. It is readily apparent from FIG. 6 that a noise filter with socket in accordance with the present invention is superior to the conventional individual components with respect to damping by more than several tens MHz.

A noise filter as in FIGS. 1-5 has a number of advantageous features as mentioned below.

(1) Since the power input socket 2 is integrally assembled with the noise filter, there is no necessity for mounting a noise filter separately and then carrying out a wiring operation therefor. As a result, reduced manpower is required for separate assembling and wiring, and improved space utilization is ensured.

(2) It is possible to fit or insert the noise filter/socket into a panel or the like means for an electronic appliance or apparatus in the same manner as in a conventional socket. It is thus very easy to be used.

(3) Since pierce type capacitors are employed for the purpose of removing or transferring the received power input, increased damping is ensured in the high frequency area. Further, since the feed through terminals of the pierce type capacitors are designed each in the form of a faston tab, it is possible to make a connection to the electronic appliance or apparatus by means of faston receptacles. In other words, the feed through terminal of the capacitor serves as a power output contact. Thus, a high degree of freedom is ensured relative to connection.

(4) Fixation of the power input socket 2 to the box-shaped case 1 made of metallic material is performed by way of the steps of inserting the grounding contact 12 of the socket into the grounding member 13 in the case and then soldering both the members; at the same time electrical connection is made between the grounding contact 12 and the grounding terminal 4 via the grounding member 13 and the case 1. Thus a noise filter in accordance with the present invention is simple in structure and is easy to be assembled.

(5) Since the box-shaped case 1 made of metallic material is lined with an insulating film 20 made of polyester or the like material over the inner wall thereof, there is no necessity for molding plastic material for the case 1. As a result, reduced manufacturing cost is ensured.

(6) The arrangement of flange portion 5 outside the front part of the case 1 provides tight sealing and shielding between both the input and output sides of the socket 2 so that any entrance of outside noise is satisfactorily prevented.

Next, FIGS. 7 to 11 illustrate a slightly modified noise filter with a socket attached thereto. A box-shaped case 1A made of current-carrying magnetic metallic material is provided with a power input socket 2A with a fuse holder attached thereto. The power input socket 2A is fitted into the case opening at the front part thereof. The case is provided with a pair of pierce type capacitors 3A and 3B and grounding terminal 4A at its rear part. The case 1A is also formed with a flange portion 5A which extends outwardly from the front opening of the case, the flange portion 5A serving to shield the rear face of the socket 2A and having drilled holes 7A which are located in alignment with the corresponding holes 6A of the socket 2A.

The socket 2A is formed with a deep cavity 10 which receives a plug to be fitted therein, wherein a pair of power input contacts 11A and 11B and a grounding contact 12 extend into the cavity 10 to be fixed therein. Further, at the front part of the socket 2A is provided a fuse holder 30. The fuse holder 30 comprises a fuse receiving cavity 31, fuse supporting poles 32, and a cover 34 with a fuse support 33 integrally molded therewith. The cover 34 is constructed so that both ends of the fuse 35 are in engagement with the fuse holding poles 32 when the cover 34 is fitted into the fuse receiving cavity 31. The power input socket 2A with fuse holder as described above is fixedly secured to the case 1A by first fitting the socket 2A into the case 1A, then soldering both the grounding contact 12 and grounding extension member 36 of the grounding terminal 4A inserted from the rear face of the case 1A, and at the same time soldering the grounding terminal 4A to the case 1A.

Figure 11:
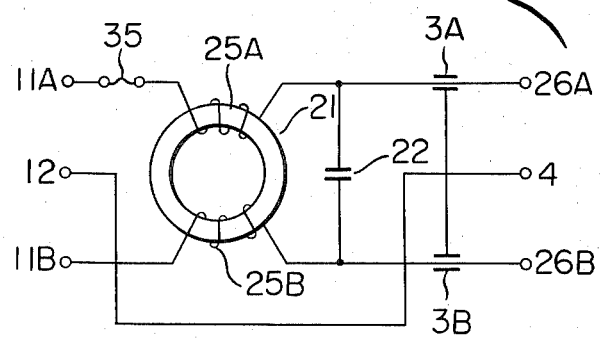
FIG. 11 is a schematic wiring diagram of the noise filter of FIGS. 7–10.

The case 1A is lined with an insulating film 20A over its inner surface, and a common mode choke 21 and a capacitor 22 are contained in the hollow space defined by the insulating film 20A. FIG. 11 is a schematic wiring diagram of the unit of FIGS. 7-10; the circuit is the same as that of FIG. 5, except that the fuse 35 is connected in series with the coil winding 25A of the common mode choke coil 21.

It will be readily understood that a noise filter as in FIGS. 7-11 functions in the same manner as that of FIGS. 1-5 and additionally offers improved safety because of the fuse incorporated therein, thereby enlarging its application.

Figure 12:
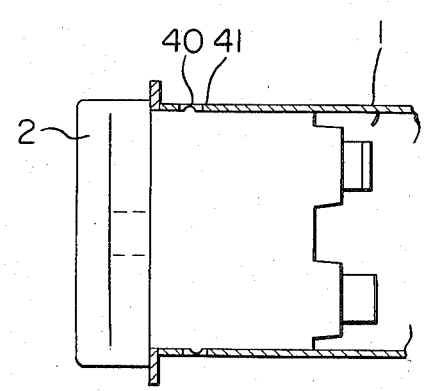
FIG. 12 is a partial sectional side view of another noise filter embodying the present invention.

In the foregoing embodiments, the socket 2 or 2A is fixedly secured to the case 1 or 1A by way of soldering the grounding member to the case, the grounding member being fixed to the grounding contact 12. Alternatively, the socket 2 may be secured to the case 1 by way of engagement of a protrusion 40 on the socket 2 to a recess 41 on the inner wall of the case 1, as illustrated in FIG. 12.

Further, the dielectric porcelain in the pierce type capacitors 3A and 3B may be replaced with another porcelain having the characteristic of a varister. This substitution causes the pierce type capacitors 3A and 3B to function as a varister; as a result, it is possible to protect an electronic appliance or apparatus by absorbing abnormal voltage surges caused by lightning or the like.

As apparent from the above description, the present invention provides a noise filter with a socket attached thereto which requires less operation for assembling and wiring since the power input socket is integrally assembled with the noise filter, and moreover ensures improved noise removal or reduction by transferring power via pierce type capacitors.

The embodiments disclosed herein are susceptible of modification. The invention thus is defined by the following claims.

We claim:
1. A noise filter comprising;
a casing made of metallic material;
a power input socket having a pair of power input contacts and a grounding contact that is mounted on one of the walls of said casing and is electrically coupled to said casing;
a pair of feed through type capacitors, each including a ground conductor mounted on another wall of said casing and a center rod that extends outwardly to serve as a power output contact;

a choke coil with a pair of windings mounted in said casing;

a capacitor mounted in said casing and electrically coupling together said center rods of said feed through capacitors;

each of said power input contacts being electrically coupled to a center rod of said feed through type capacitor by an individual one of said windings.

2. A noise filter with a socket attached thereto as set forth in claim 1, in which the socket is fixedly secured to the casing by a grounding member soldered to the casing, said grounding member being tightly fixed to said grounding contact.

3. A noise filter with a socket attached thereto as set forth in claim 1, in which the socket is secured to the casing by being interfitted into said casing.

4. A noise filter with a socket attained thereto as set forth in claim 1, in which the socket has a fuse incorporated therein, said fuse being connected in series with one of said coil windings.

5. A noise filter with a socket attached thereto as set forth in claim 1, in which said feed through type capacitors have a varister characteristic.

* * * * *